(12) United States Patent
Lewis et al.

(10) Patent No.: US 9,078,349 B1
(45) Date of Patent: Jul. 7, 2015

(54) UNIVERSAL FILLER-BEZEL CLIP ASSEMBLY

(75) Inventors: Jeffrey M. Lewis, Maynard, MA (US); Joseph L. Brigham, Jr., North Attleboro, MA (US)

(73) Assignee: EMC Corporation, Hopkinton, MA (US)

( * ) Notice: Subject to any disclaimer, the term of this patent is extended or adjusted under 35 U.S.C. 154(b) by 206 days.

(21) Appl. No.: 13/611,571

(22) Filed: Sep. 12, 2012

(51) Int. Cl.
- *H05K 7/18* (2006.01)
- *A47B 47/00* (2006.01)
- *H05K 5/02* (2006.01)

(52) U.S. Cl.
CPC ......... *H05K 5/0204* (2013.01); *Y10T 24/44026* (2015.01)

(58) Field of Classification Search
CPC . B25B 5/08; Y10T 24/3969; Y10T 24/44017; Y10T 24/309; Y10T 24/44026; A47B 88/04; A47B 88/044
USPC ................ 24/457, 458, 581.11, 591.1, 594.1, 24/593.1, 593.11; 312/111, 140, 334.4; 211/26, 192; 248/292.12, 316.7, 248/231.31, 222.11, 222.13, 231.81; 269/217, 138, 229, 234
See application file for complete search history.

(56) References Cited

U.S. PATENT DOCUMENTS

| | | | | |
|---|---|---|---|---|
| 1,309,067 A | * | 7/1919 | Heltzel | 269/188 |
| 2,916,244 A | * | 12/1959 | Renfroe | 248/228.2 |
| 3,862,737 A | * | 1/1975 | Fuston, Jr. | 249/196 |
| 4,665,590 A | * | 5/1987 | Udelhofen et al. | 24/115 H |
| 5,730,432 A | * | 3/1998 | Gendreau et al. | 269/41 |
| 2010/0303543 A1 | * | 12/2010 | Myers | 403/374.3 |

* cited by examiner

*Primary Examiner* — Robert J Sandy
*Assistant Examiner* — Michael Lee
(74) *Attorney, Agent, or Firm* — Krishnendu Gupta; Knorad R. Lee

(57) ABSTRACT

A filler bezel clip assembly for an electrical cabinet having a chassis mounting rail. The assembly includes: a bezel clip member for disposition on one surface of one of the rail; and, a wedge bracket member. The bezel clip member has: a slot; a hook for attachment to a bezel; and a first portion of a ratchet mechanism. The wedge bracket member is for insertion into the slot and includes: a tapered surface having a forward, narrower portion of the tapered surface for engaging an opposite surface of the rail; and a second portion of the ratchet mechanism for engagement with the first portion of a ratchet mechanism as the forward, portion of the tapered surface slides over the opposite surface of the rail during insertion of the wedge bracket member into the slot. The bezel clip member includes posts for insertion into round and square holes in the rail.

6 Claims, 12 Drawing Sheets

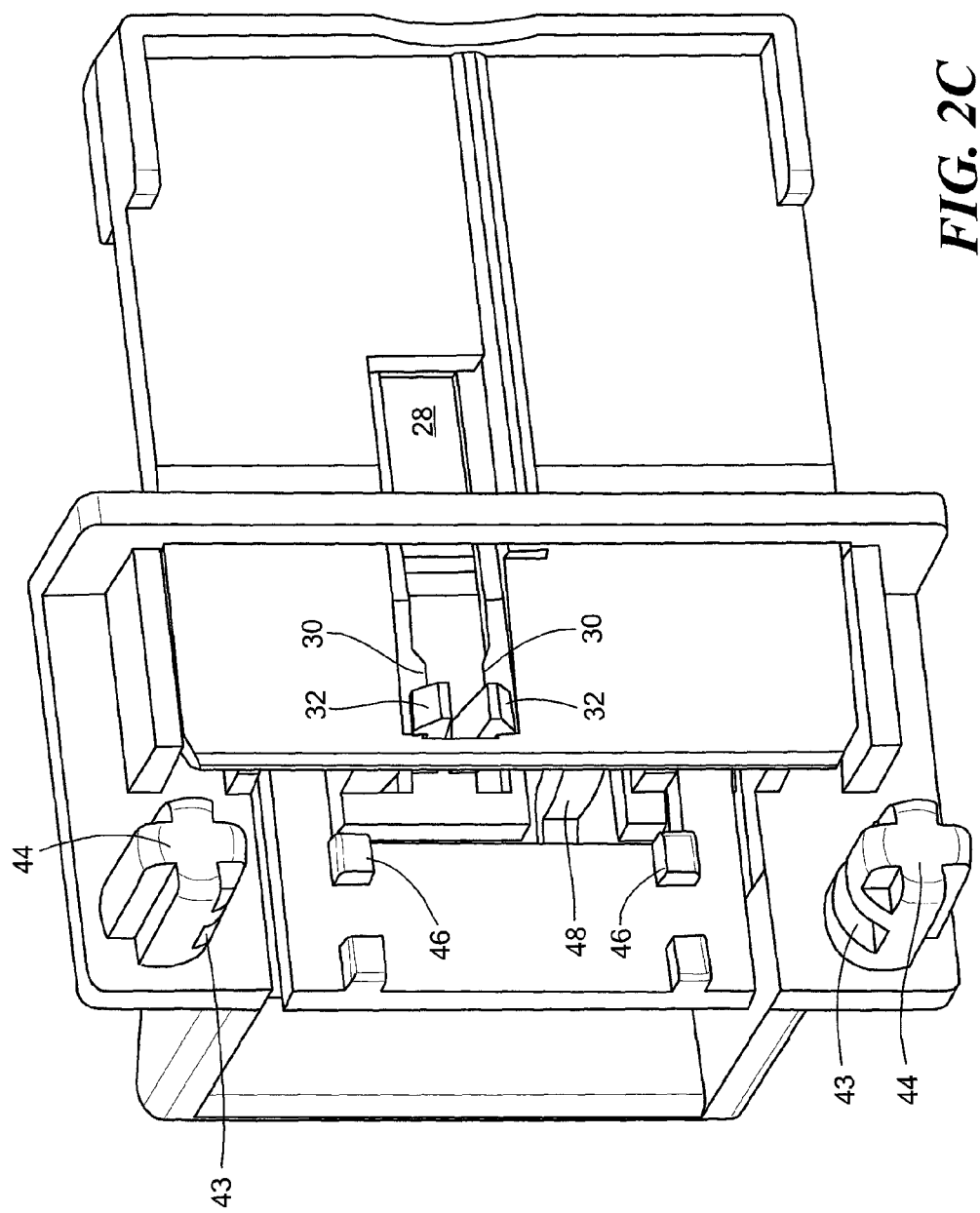

UNIVERSAL FILLER-BEZEL CLIP ASSEMBLY

TECHNICAL FIELD

This disclosure relates generally to bezel clips and more particularly to universal filler bezel clip assemblies.

BACKGROUND AND SUMMARY

As is known in the art, electrical cabinets are provided to store a rack of electrical chassis. These cabinets typically have a front pair of spaced vertically extending rails and rear pair of spaced vertically extending rails. The front rails are provided with holes for securing a bezel mounted to the front of the chassis. Different cabinets may have rails of different thicknesses and may have square shaped holes or circular shaped mounting holes.

As is also known, one such application for such chassis is in data storage systems. As is further known, it is common for a purchaser to initially start with a storage system having an initial stage capacity with the expectation that the storage capacity increase over time as business expands. In such case the cabinet may have a few chassis in the rack and rather than have empty spaces visible in the rack, filler bezels (i.e., a bezel without a chassis behind it) are inserted into the spaces where the additional chassis would be mounted in the future. The bezel of the chassis is typically adapted to hook into a receiving hook or clip mounted to the front rails of the cabinet; one such arrangement being described in U.S. Pat. No. 7,232,193 assigned to the same assignee as the present patent application. Also described therein is a latching mechanism for a bezel adapted to attach to the hook.

The inventors have recognized that it would be desirable to have a universal hook or clip assembly adapted for attachment to rails of different thickness and having either round or square attaching holes. That is, the inventors have recognized that single unit plastic clips for all bezel sizes do not: accommodate square hole/round hole racks; do not accommodate varying rack-rail thicknesses; do not accommodate varying rack hole-to-rail distances; are very difficult to both install and remove; and are not reliably reusable because they are generally loose fitting after the first use.

In accordance with the present disclosure, a filler bezel clip assembly is provided for an electrical cabinet having a chassis mounting rail. The assembly includes: a bezel clip member for disposition on one surface of one of the rail, the bezel clip member having a slot therein; and a wedge bracket member having a forwardly narrowing, tapered surface for insertion into an opposite surface of the rail. The slot receives the forwardly narrowing, tapered surface of the wedge bracket member pivoting the forwardly narrowing, tapered surface against said opposite surface of the rail.

In one embodiment, a filler bezel clip assembly for an electrical cabinet having a chassis mounting rail is provided. The assembly includes: a bezel clip member for disposition on one surface of one of the rails and a wedge bracket member. The bezel clip member has: a slot; a hook for attachment to a bezel; and a first portion of a ratchet mechanism. The wedge bracket member is for insertion into the slot and includes: a tapered surface having a forward, narrower portion of the tapered surface for engaging an opposite surface of the rail; and a second portion of the ratchet mechanism for engagement with the first portion of a ratchet mechanism as the forward portion of the tapered surface slides over the opposite surface of the rail during insertion of the wedge bracket member into the slot.

In one embodiment, the bezel clip member includes posts for insertion into round and square holes in the rail.

In one embodiment, a locking mechanism is provided for locking the bezel clip member to the wedge bracket member, wherein the bezel clip member has one portion of the locking mechanism and the wedge bracket member has another, engaging portion, of the locking mechanism In one embodiment, one of the bezel clip member and the wedge bracket member has a release mechanism for unlocking the bezel clip member and the wedge bracket member.

In one embodiment, the first type of post is on a first portion of the bezel clip member and the second type of post is on a second portion of the bezel clip member, the second portion being movable with respect to the first portion.

In one embodiment, the hook and the slot project in opposite directions from the rail.

With such an arrangement, the inventors have provided a two-piece assembly having a clip piece and an insertable wedge piece that accommodates round-hole and square-hole rack mounting, provides a tight fit to varying rack-rail thickness, and accommodates varying rack inner rail-to-hole dimensions (distances). The assembly works with square-hole or round-hole racks (both industry standard shapes), makes a tight-fitting clip independent of the rack-rail material thickness, allows varying rack hole-to-rail distances, is easy to installed/remove, and, is reusable.

The details of one or more embodiments of the disclosure are set forth in the accompanying drawings and the description below. Other features, objects, and advantages of the disclosure will be apparent from the description and drawings, and from the claims.

DESCRIPTION OF DRAWINGS

FIGS. 2A-2D are sketches of an exemplary of the universal filler bezel clip assemblies of FIG. 1 at various stages in the assembly thereof;

Like reference symbols in the various drawings indicate like elements.

DETAILED DESCRIPTION

Figure 1:
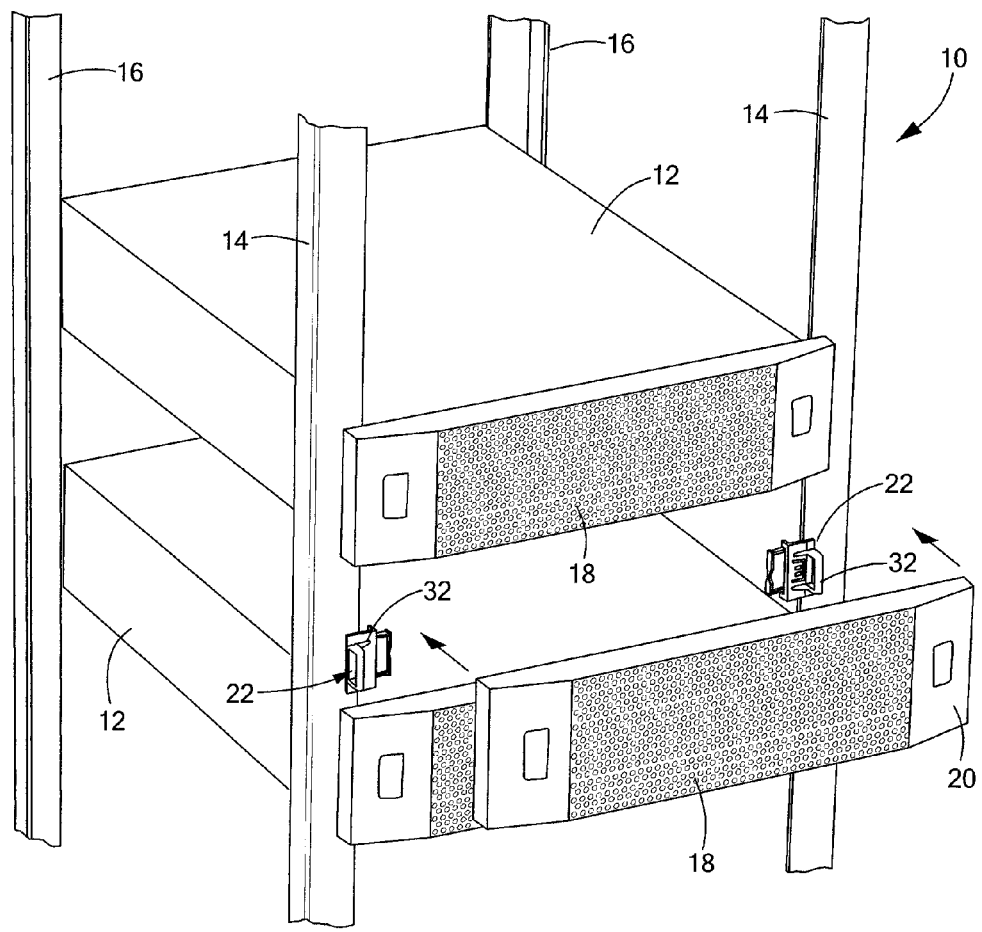
FIG. 1 is a sketch of an electrical cabinet having universal filler bezel clip assemblies according to the disclosure.

Referring now to FIG. 1, an electrical cabinet 10 is shown for storing a vertical rack of electrical chassis 12. The cabinet 10 have a front pair of spaced vertically extending rails 14 and rear pair of spaced vertically extending rails 16. The front rails 14 are provided with holes, not shown, for securing bezels 18 mounted to the front of the chassis 12. Different cabinets may have rails of different thicknesses and may have square shaped holes or circular shaped mounting holes. It is noted that a space is provided for a future chassis; however, in order to present an attractive face to the cabinet 10, a filler bezel 18 is attached to a pair of universal filler bezel clip assemblies 22 attached to the front rails 14, as indicated.

Figure 2A:
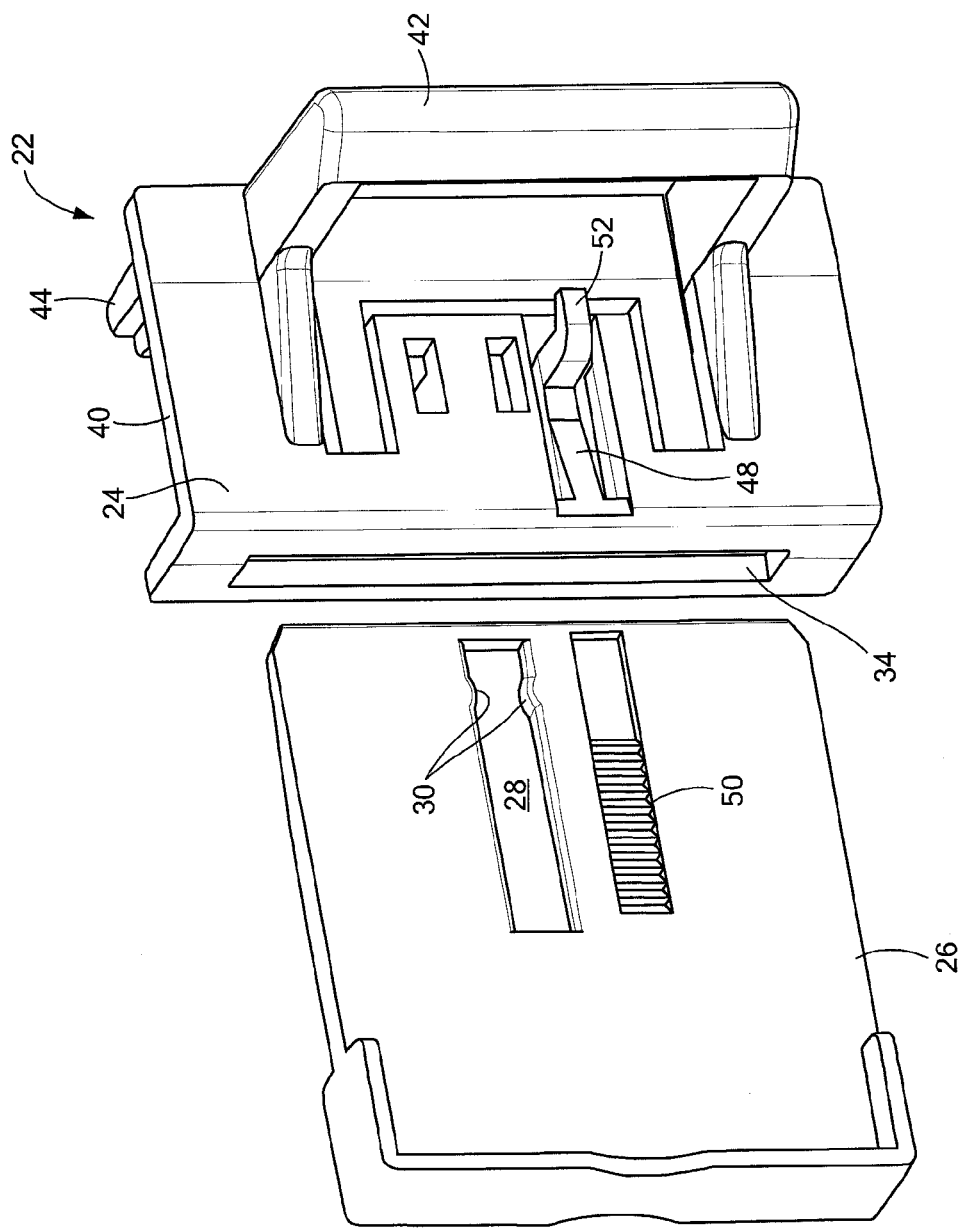
Figure 2B:
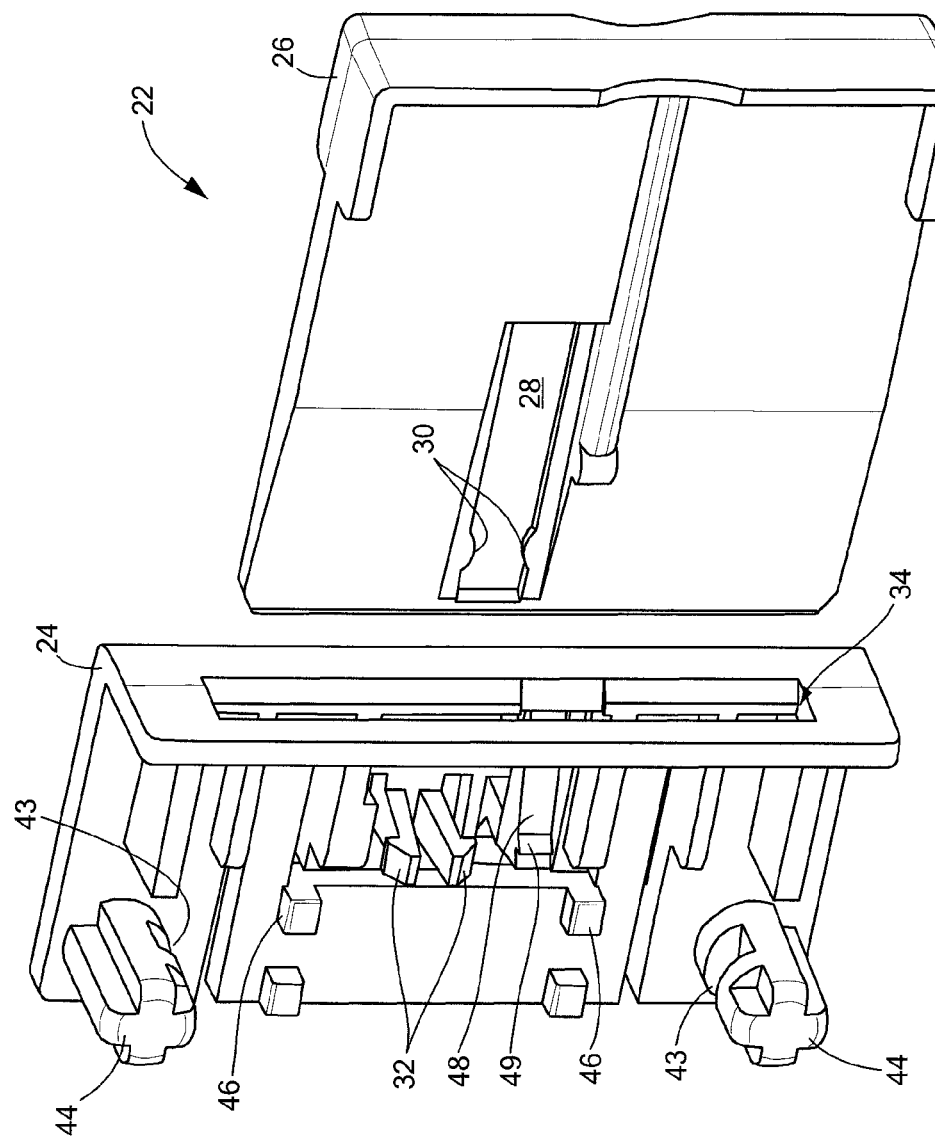

An exemplary of the universal filler bezel clip assemblies 22 is shown in FIGS. 2A-2B to include: a bezel clip member 24 and a wedge bracket member 26. It is noted that prior to insertion of the universal filler bezel clip assembly 22 onto a rail 14 (FIG. 1), the two pieces, i.e., the bezel clip member 24 and the wedge bracket member 26 are attached together as a unit by the locking mechanism, to be described. More particularly, the wedge bracket member 26 includes a slot 28 having a pair of side formed detents 30. The bezel clip member 24 includes: a slot 34 for receiving the wedge bracket member 26; and a pair of opposing, cantilevered flexible opposing posts 32, each post 32 having barbed ends to engage a corresponding one of the pair of detents 30. Thus, the wedge bracket member 26 is inserted into a slot 34 of bezel clip member 24, the cantilevered posts 32 snap into the slot 28 as shown in FIG. 2C. As the wedge bracket member 26 continues to slide forward, the flexible posts 32 are urged towards each other as the ride over the forward, upwardly sloped surface of the detents 30. When the posts 32 are on the other side of rearward, downward sloped surface of the detents 30, the wedge bracket member 24 is allowed to slide back and forth while staying assembled to the bezel clip member 24. Thus, the wedge bracket member 26 is locked to the bezel clip member 24 as soon as it is snapped on. The detents 30 hold the bezel clip member 24 and a wedge bracket member 26 in the "assemble-ready" position i.e., in the proper position to be assembled on to one of the front rails 13 The bezel clip member 24 and the wedge bracket member 26 can be separated by manually squeezing the ends of the posts 32 together, i.e., towards one another, pushing them rearward out of the way of the slot 28 and thereby out of the way of the detents 20 (i.e., behind the slot 28 in the wedge bracket member 26 to enable the wedge bracket member to slide rearward and thereby be separated from the bezel clip member 24 as shown in FIGS. 2A and 2B.

Figure 2D:
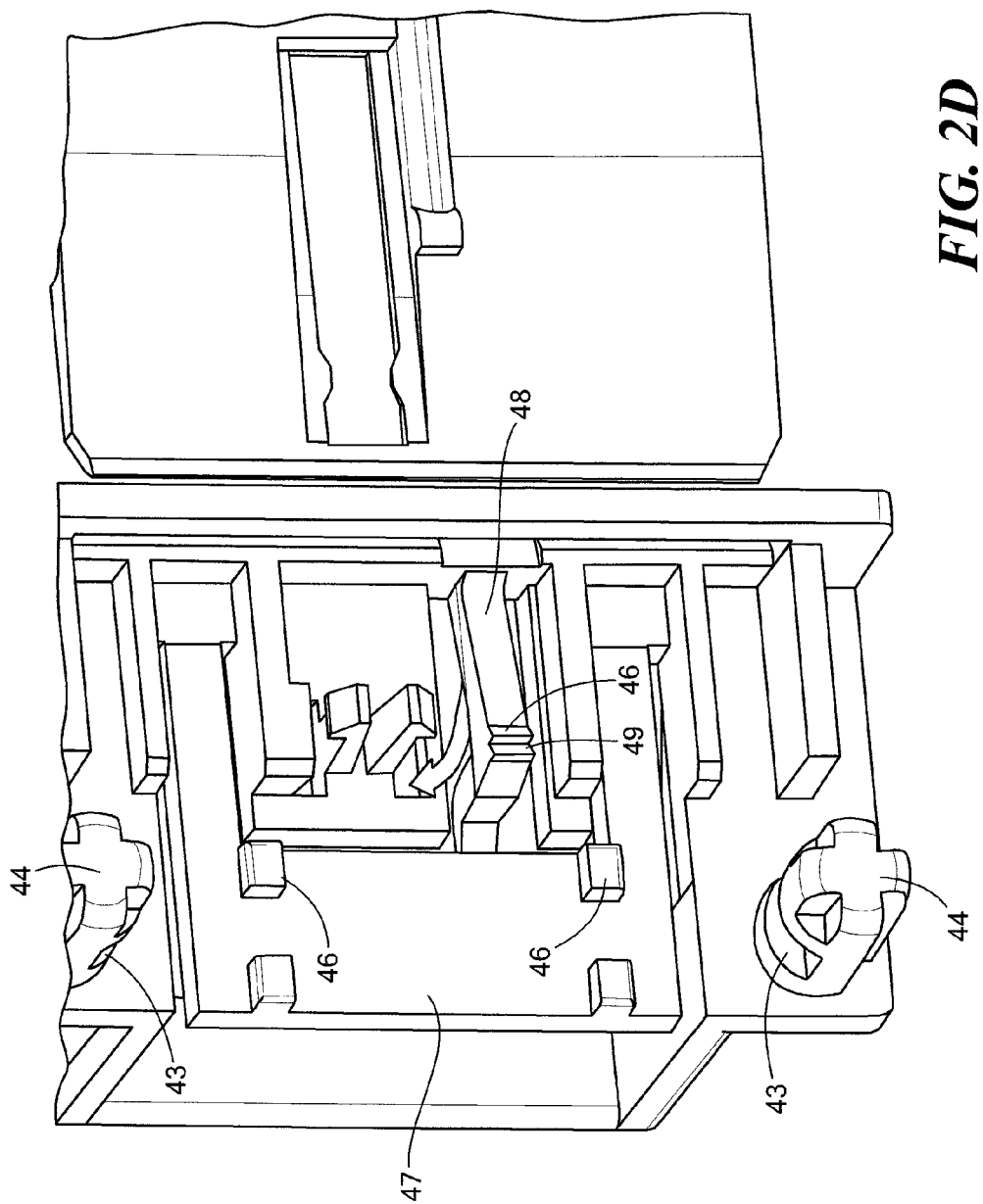
Figure 2E:
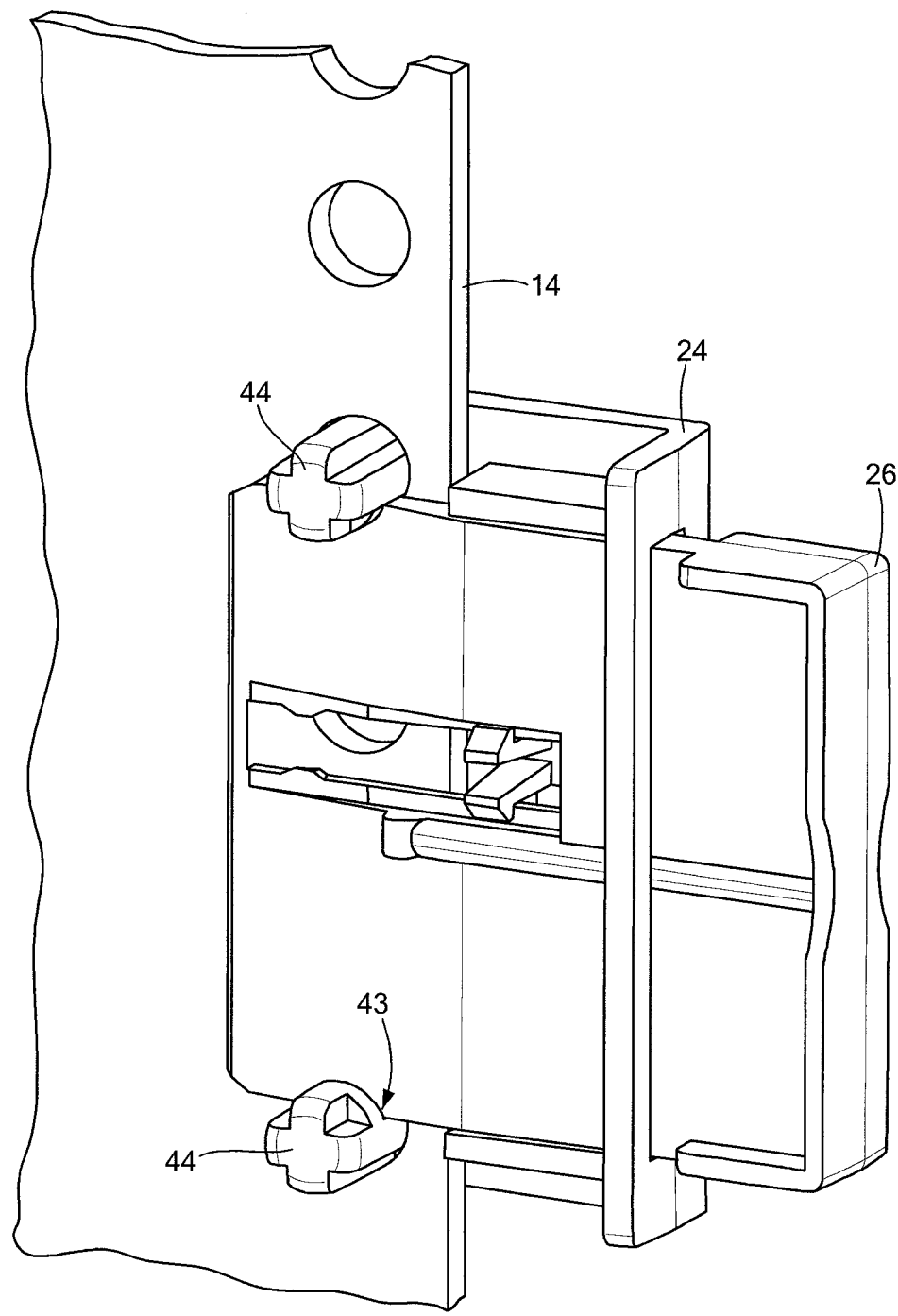
FIG. 2E-2H are sketches of the filler bezel clip assembly of FIG. 1 attached to a rail of the cabinet of FIG. 1.
Figure 2F:
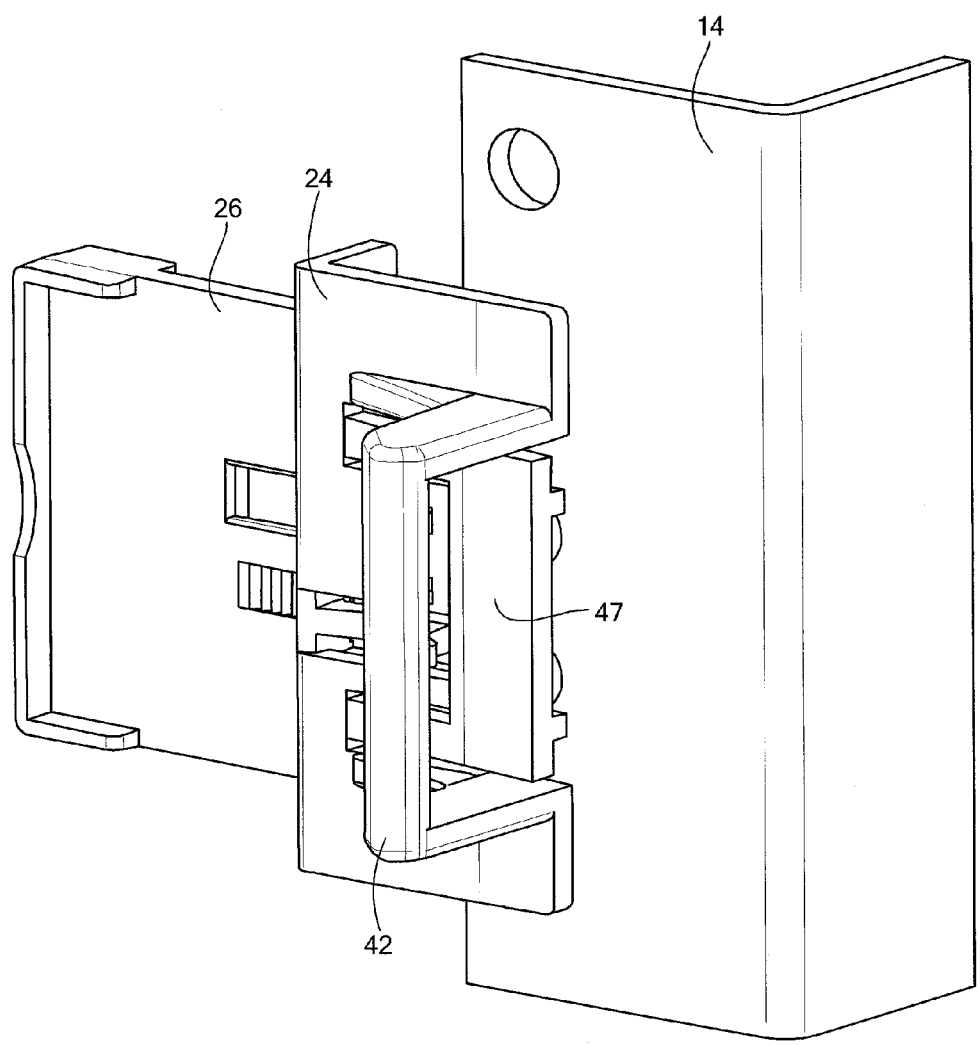
Figure 2G:
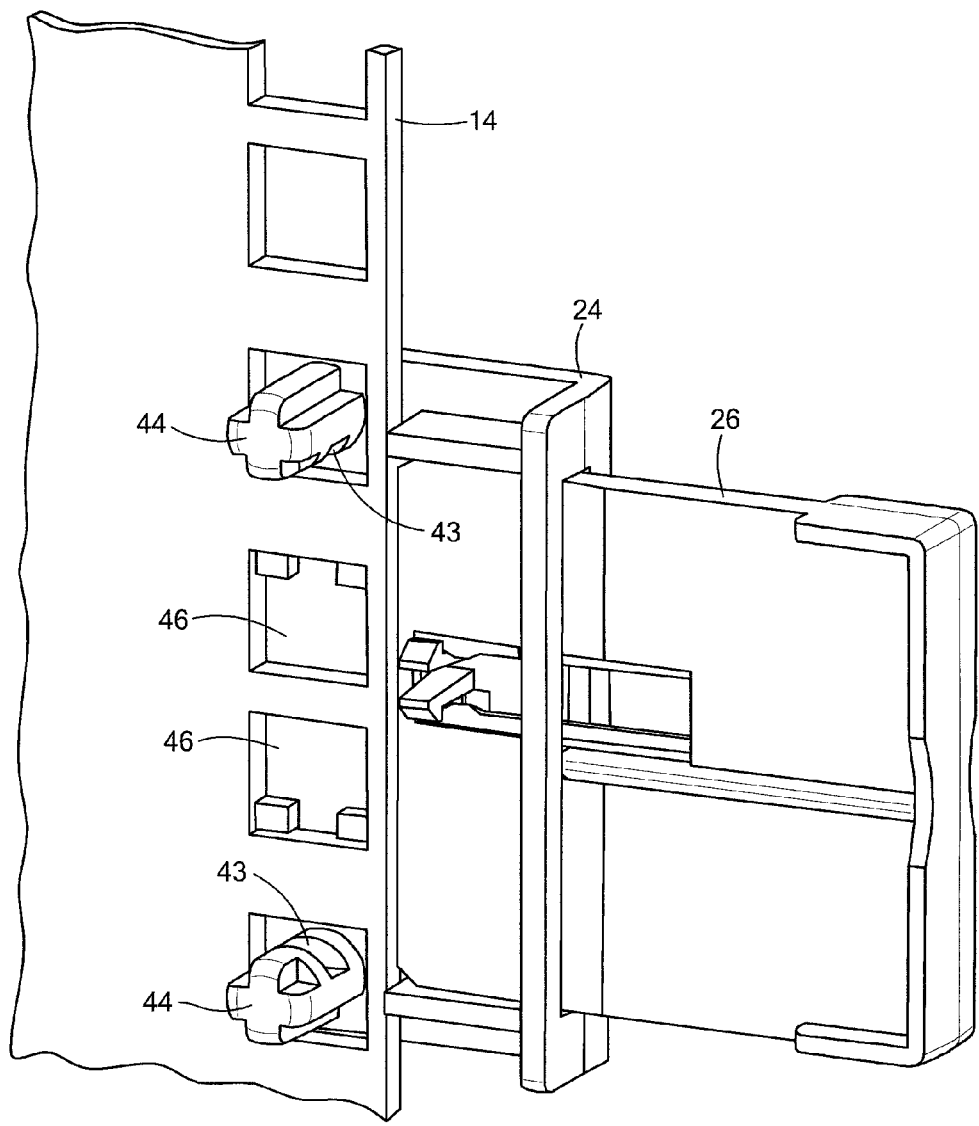
Figure 2H:
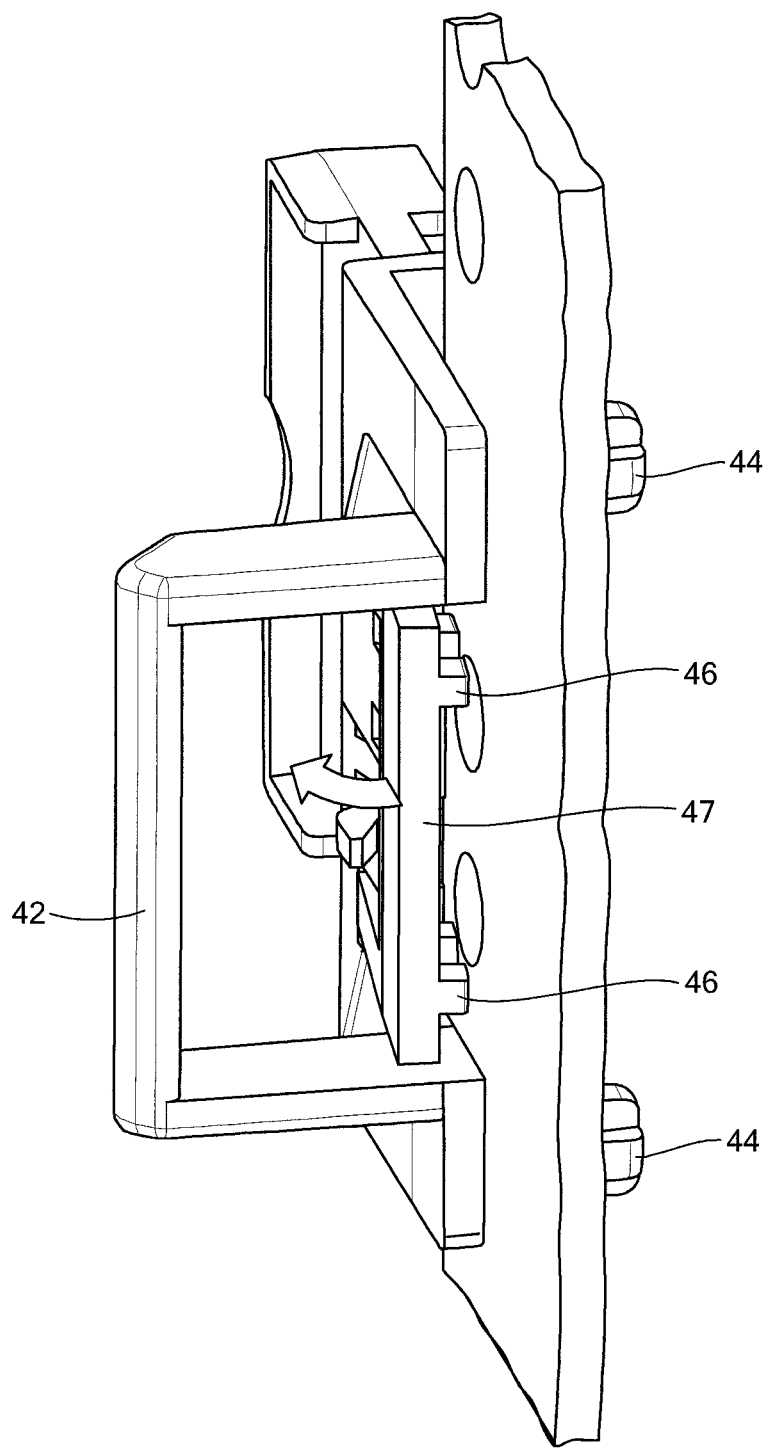

More particularly, the bezel chip member 24 (FIG. 2A) has a rail mounting member 40 and a hook member 42. The hook member 42 is adapted to receive a bezel latching mechanism (not shown) on a bezel 18 (FIG. 1) and is disposed at a right angle to the rail mounting member 28. An example of a rail latching member is described in U.S. Pat. No. 7,232,193 issued Jun. 19, 2007 inventors Cunningham et al., assigned to the same assignee as the present invention. The rail mounting member 40 has the slot 34 therein to receive the wedge bracket member 26. The clip member 24 has posts 44 for use with rails 14 (FIG. 1) with round holes (FIGS. 2E, 2F) and posts 46 for use with rails 14 (FIG. 1) with square holes (FIGS. 2G, 2H); it being noted that the rounded posts 44 are small enough to fit through the square holes and the square posts 46 are attached to cantilever member 47 (FIG. 2D) which allows them to swing rearward when the round posts 44 are inserted into rail 14 with round holes. Conversely, when clip 24 is mounted on a rail 14 with square holes, square posts 46 fit in the square holes on rail 14 to align clip 24, and cantilever member 47 does not swing. It is noted that the posts 44 have slots 43 therein for receiving the forward edge of the wedge bracket member 22.

Figure 3A:
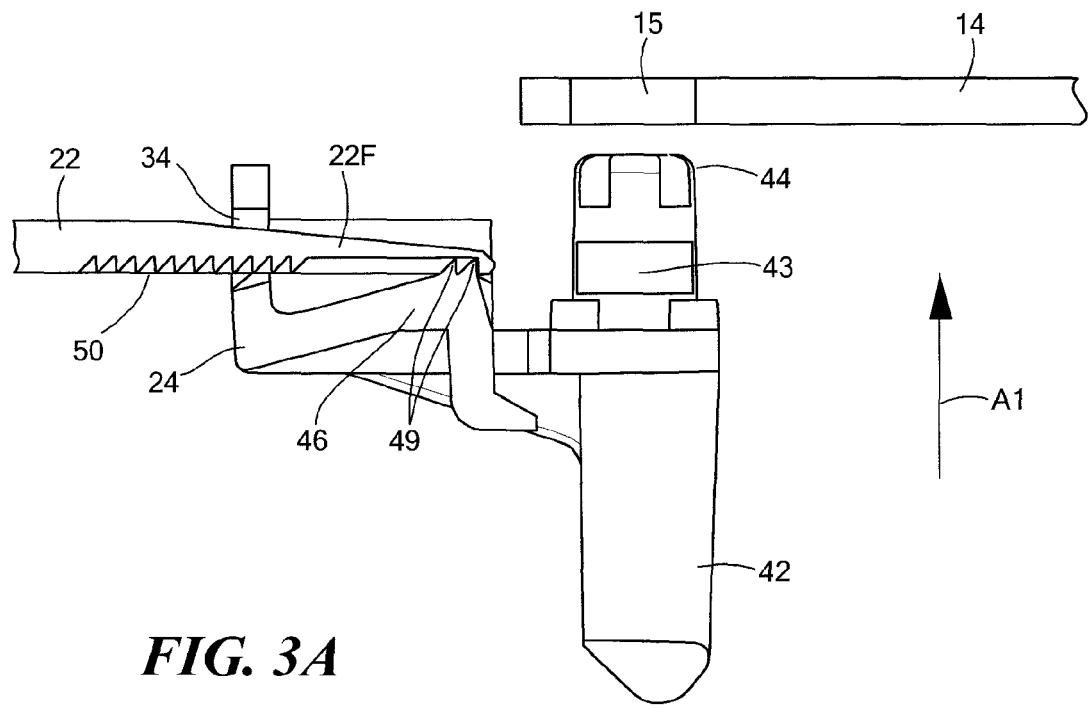
FIGS. 3A and 3B show the process of insertion of the assembly of FIGS. 2A=2D onto a rail of the cabinet of FIG. 1.
Figure 3B:
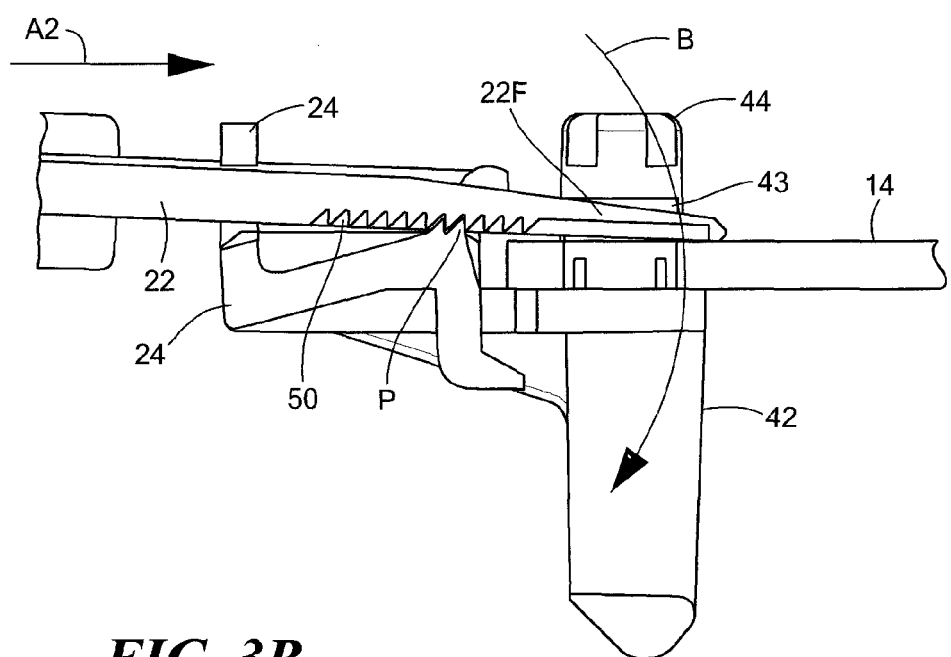

The clip member 24 has a flexible, cantilevered pawl 48 having mating teeth 49 (FIG. 2D) to receive ratchet teeth 50 on the wedge bracket member 26. As will be described, the bezel clip member 24 and the wedge bracket member 26 (as an assembly) are located on opposite sides of the rail 14 during the assembly mounting process. The wedge bracket member 26 being tapered downwardly from the front to the rear wedges the clip member 24 onto rails 14 by insertion of the wedge bracket member 26 into the slot 34 in a manner to be described in detail hereinafter. Suffice it to say here that the clip member 24 has a surface on one side of the rail 14 and the wedge bracket member 26 is slipped over the opposing side of the rail 14. First the post 44 is inserted into a hole 15 of rail 14 as indicated by arrow A1 in FIG. 3A. Next, the wedge bracket member 26 has its forward insertion through slot 34 moved forward in the direction of arrow A2 in FIG. 3B over the opposing side of the rail 14 with the narrower, forward portion 22F of the wedge bracket member 26 being inserted into the slot 43 of the post 44 as shown in FIGS. 3A and 3B, pivots the narrower, forward portion 22F of the wedge bracket member 30 about point P (FIG. 3B) as it moves towards the rail 14 and against the rail 14 as the ratchet teeth 50 successively engage the teeth 49 on pawl 48 until the two pieces (i.e., the bezel clip member 24 and a wedge bracket member 26) are wedged tight against the rail 14 and thereby locks the two pieces together onto the rail 14 independent of the thickness of the rail 14. As noted above, the pawl 48 is cantilevered and therefore the two wedged pieces (i.e., the bezel clip member 24 and a wedge bracket member 26) can be removed from the rail by lifting end 52 (FIG. 2A) of the pawl outwardly to release the teeth 49 from the teeth in the ratchet 50 and sliding the wedge bracket member 26 rearwards. Thus, the slot 43 receives the forwardly narrowing, tapered surface of the wedge bracket member 26 pivoting the forwardly narrowing, tapered surface against said surface of the rail 14 as indicated by the arrow labeled B.

Figure 3C:
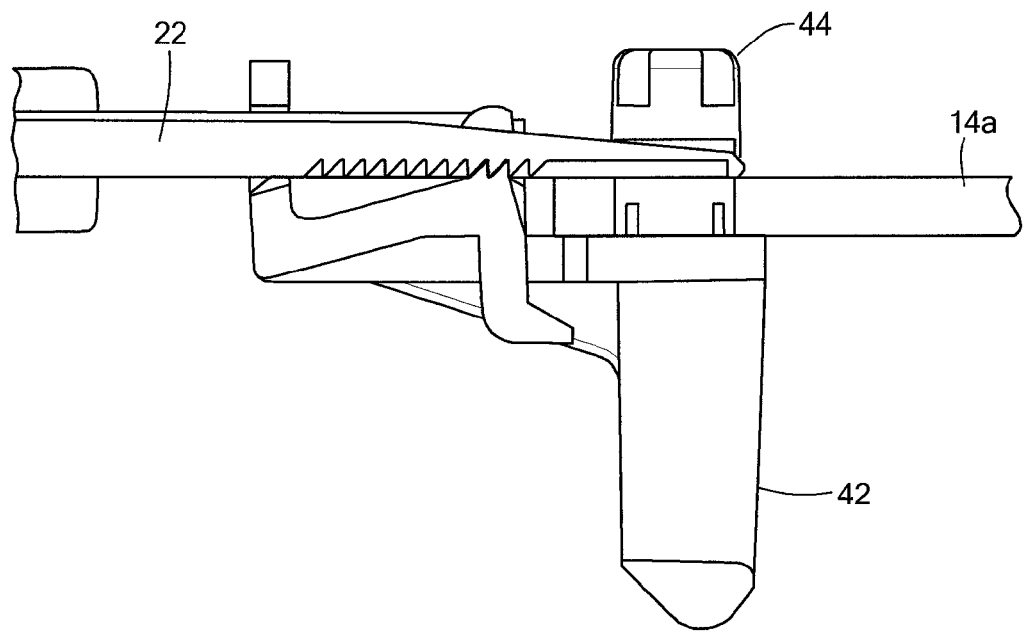
FIGS. 3C and 3C show insertion of the assembly of FIGS. 2A=2D onto rails of the cabinet of FIG. 1 having different thicknesses.
Figure 3D:
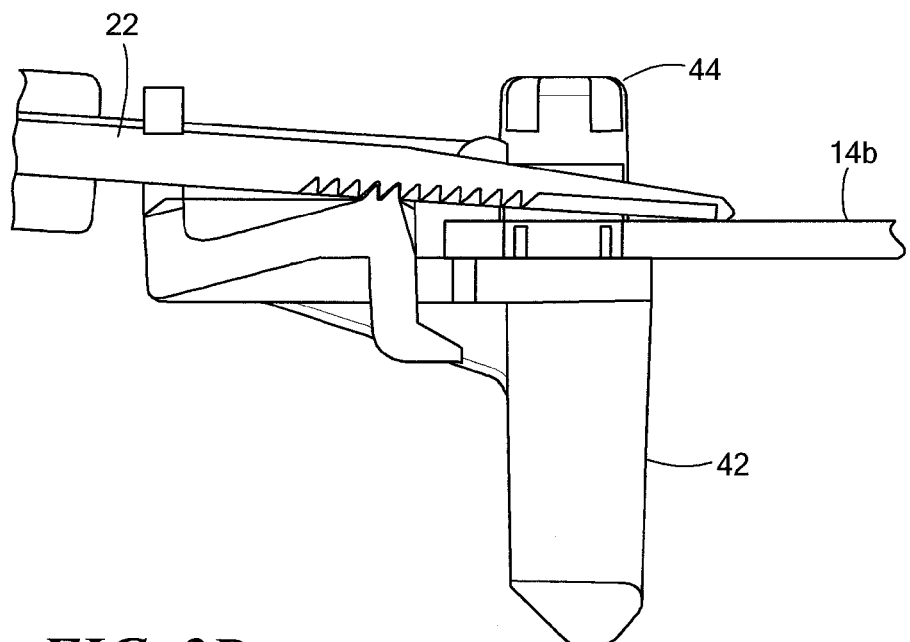

FIG. 3C shows the insertion of the wedge bracket member 22 over a rail 14a thicker than the rail 14 shown in FIG. 3A and FIG. 3D shows the insertion of the wedge bracket member 22 over a rail 14b thinner than the rail 14 shown in FIG. 3A.

Figure 4:
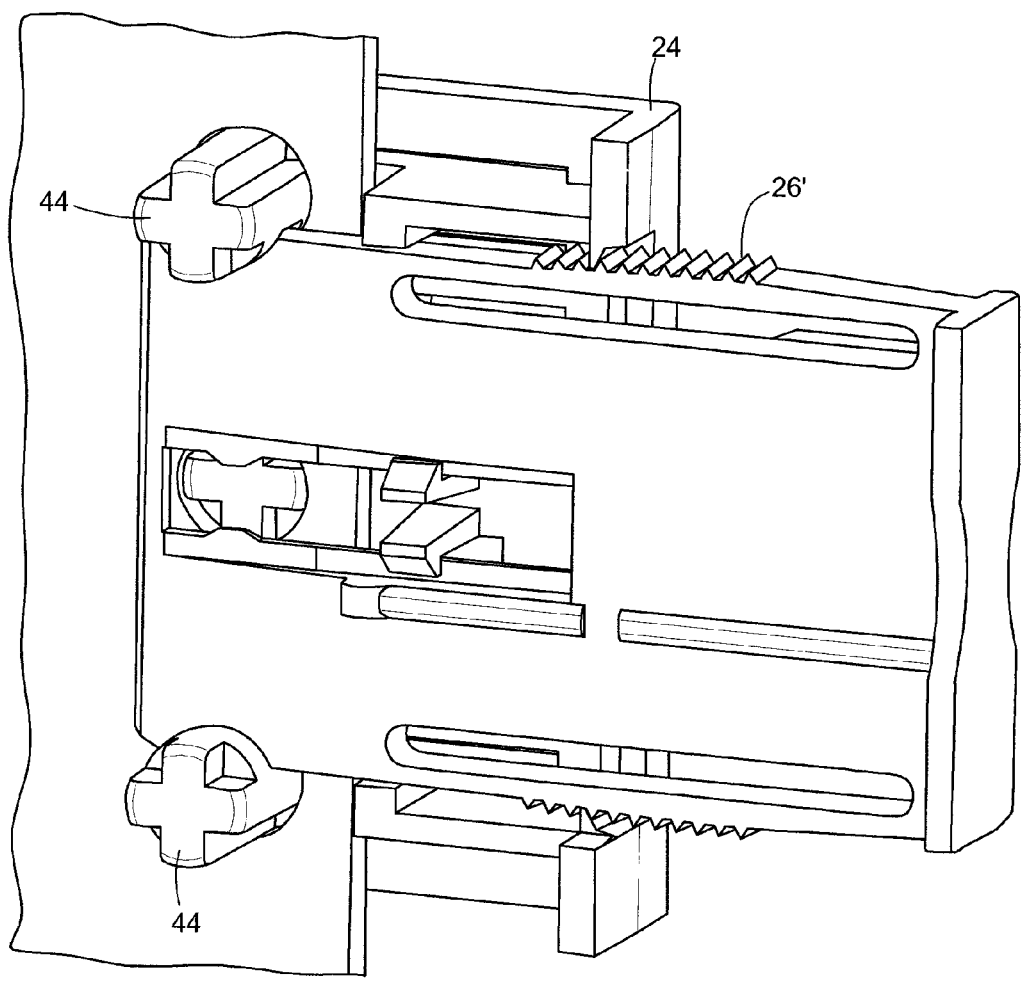
FIG. 4 is a sketch of a universal filler bezel clip assembly according to another embodiment of the disclosure.

FIG. 4 shows another embodiment of the disclosure. Here the pawl and ratchet are mounted on the upper and lower sides of the bezel clip member 24' and a wedge bracket member 26'.

A number of embodiments of the disclosure have been described. Nevertheless, it will be understood that various modifications may be made without departing from the spirit and scope of the disclosure. Accordingly, other embodiments are within the scope of the following claims.

What is claimed is:

1. A filler bezel clip assembly for an electrical cabinet having a chassis mounting rail, comprising:
    a bezel clip member for disposition on one surface of one of the rail, comprising:
        a slot;
        a hook for attachment to a bezel; and
        a first portion of a ratchet mechanism;
    a wedge bracket member for insertion into the slot, comprising:
        a tapered surface having a forward, narrower portion surface for engaging an opposite surface of the rail;
        a second portion of the ratchet mechanism for engagement with the first portion of a ratchet mechanism as the forward, narrower portion of the tapered surface slides over the opposite surface of the rail during forward insertion of the wedge bracket member into the slot; and
    wherein the bezel clip member includes posts for insertion into holes into the rail.

2. The filler bezel clip recited in claim 1 wherein a first type of the posts is configured for insertion into round holes in the rail and a second type of the posts is configured for insertion into square holes in the rail.

3. The filler bezel clip recited in claim 1 wherein one of the bezel clip member and the wedge bracket member has a release mechanism for unlocking the bezel clip member and the wedge bracket member.

4. The filler bezel clip recited in claim 2 wherein the first type of post is on a first portion of the bezel clip member and the second type of post is on a second portion of the bezel clip member, the second portion being movable with respect to the first portion.

5. The filler bezel clip recited in claim 4 wherein the one of the first portion and second portion is on a cantilevered portion of the bezel clip member.

6. The filler bezel clip recited in claim 1 wherein the hook and the slot project in opposite directions from the rail.

\* \* \* \* \*